(12) United States Patent
Lee et al.

(10) Patent No.: US 6,617,254 B2
(45) Date of Patent: Sep. 9, 2003

(54) METHOD FOR MANUFACTURING CATHODE ELECTRODES OF ELECTROLUMINESCENT DISPLAY DEVICE

(75) Inventors: Joo Hyeon Lee, Kyoungki-do (KR); Woo Young Kim, Seoul (KR); Sung Hoo Ju, Kyoungki-do (KR); Sun Woong Kim, Seoul (KR)

(73) Assignee: Boe-Hydis Technology Co., Ltd., Kyoungki-do (KR)

( * ) Notice: Subject to any disclaimer, the term of this patent is extended or adjusted under 35 U.S.C. 154(b) by 0 days.

(21) Appl. No.: 09/993,746

(22) Filed: Nov. 6, 2001

(65) Prior Publication Data

US 2002/0058420 A1 May 16, 2002

(30) Foreign Application Priority Data

Nov. 14, 2000 (KR) .................................. 2000-0067352

(51) Int. Cl.$^7$ ............................................. H01L 21/311
(52) U.S. Cl. .................................... 438/702; 438/708
(58) Field of Search ........................... 438/700, 702, 438/703, 708; 313/509, 512, 506

(56) References Cited

U.S. PATENT DOCUMENTS

| | | | | |
|---|---|---|---|---|
| 5,448,133 A | * | 9/1995 | Ise ................................. | 313/497 |
| 5,688,551 A | * | 11/1997 | Littman et al. ................ | 427/64 |
| 5,858,564 A | * | 1/1999 | Tamura et al. ............... | 428/690 |
| 6,111,357 A | * | 8/2000 | Fleming et al. ............. | 313/509 |

FOREIGN PATENT DOCUMENTS

JP  9-82476  * 3/1997

* cited by examiner

*Primary Examiner*—Kin-Chan Chen
(74) *Attorney, Agent, or Firm*—Ladas & Parry

(57) ABSTRACT

Disclosed is a method for manufacturing cathode electrodes of electroluminescent display device capable of forming cathode electrodes of fine patterns. The disclosed comprises the steps of: forming an anode electrode on a transparent insulating substrate; forming an insulating partition having a stripe structure to cross with the anode electrode and define a pixel formation area on the substrate; forming an organic film pixel separated with a predetermined distance, with the insulating partition interposed; depositing a cathode metal layer on the surface of the resulting structure; and forming a cathode electrode exposing a predetermined part of the insulating partition by performing etching processes on the cathode metal layer using laser.

5 Claims, 6 Drawing Sheets

METHOD FOR MANUFACTURING CATHODE ELECTRODES OF ELECTROLUMINESCENT DISPLAY DEVICE

BACKGROUND OF THE INVENTION

1. Field of the Invention

The present invention relates to a method for Manufacturing electroluminescent display device, and more particularly, to a method for manufacturing cathode electrodes of electroluminescent display device capable of forming cathode electrodes having fine patterns.

2. Description of the Related Art

As a next generation display, self-luminescent organic electroluminescent (hereinafter referred to as EL) devices have a structure that an anode electrode, an organic thin film layer and a cathode electrode are sequentially deposited on a transparent substrate. In the passive matrix panel, the size of pixels depends on the line width of cathode electrodes and anode electrodes crossing each other and in order to obtain high resolution organic EL panel, anode pixel electrodes and cathode metal layers are formed to have a fine pattern. The pixel electrodes accomplish the fine pattern by using lithography process and the cathode electrodes by using shadow mask or by forming cathode separation partition without mask.

However, it is difficult to pattern the cathode by using the cathode separation partition since a Japanese organic panel maker, pioneer has a patent right for the method.

FIGS. 1A and 1B are cross-sectional views for showing a conventional method for manufacturing cathode electrodes of electroluminescent display device.

Referring to FIG. 1A, first, a transparent insulating substrate 11 is prepared, wherein an anode electrode 12 and an organic film layer 13 are formed in a stripe shape. Then, a shadow mask 14 is provided to form succeeding cathode electrode pattern on the organic film layer 13.

Referring to FIG. 1B, the transparent insulating substrate 11 including the anode electrode 12 and the organic film layer 13 is put into a vacuum deposition device, the organic film layer 13 being downward. Subsequently, evaporated metal ions are deposited on the transparent insulating substrate 11 having the shadow mask 14 from a metal source unit S on the lower part of the vacuum deposition device and then, pattern etch is performed to obtain a cathode electrode. As a result, the fabrication is completed for electroluminescent display device as organic EL device.

FIGS. 2 and 3 are cross sectional views for showing problems of conventional methods for fabricating cathode electrodes of electroluminescent display device.

The conventional methods for fabricating cathode electrodes of electrolumnescent display device will be described referring to the FIGS. 2 and 3.

First, according to the conventional method for fabricating cathode electrodes by using shadow mask, it is required to maintain accurate contact of alignment of shadow mask and transparent insulating substrate with shadow mask. Therefore, as the size of pixel becomes small and that of panel is increased, it is difficult to be used due to misalignment of shadow mask and inaccurate contact of transparent insulating substrate and shadow mask.

Second, as shown in FIG. 2, metal ions evaporated by the misalignment are flowed into the gap L between the shadow mask 14 and the organic film layer 13, thereby generating shorts with the anode electrode 12.

Finally, as shown in FIG. 3, when the transparent insulating substrate 11 having the shadow mask 14 is put into the vacuum deposition device, the center of the shadow mask 14 is hanging down due to the large panel, thereby generating shorts with the cathode electrode and the anode electrode. Therefore, there are problems that the shadow mask should be formed with a material having strong magnetism and additional devices are required to tightly support the shadow mask on all sides.

SUMMARY OF THE INVENTION

Therefore, the present invention has been made to solve the above problems and the object of the present invention is to provide a method for manufacturing cathode electrodes of electroluminescent display device capable of forming fine pattern cathode electrodes using laser.

In order to accomplish the above object, the present invention comprises the steps of: providing an anode electrode on a transparent insulating substrate; forming a separation partition having a stripe structure to cross with the anode electrode and define a pixel formation area on the substrate; forming organic film pixels separated from each other with insulating partition interposed; depositing a cathode metal layer on the surface of the resulting structure; and performing etching processes on the cathode metal layer by using laser to form a cathode electrode exposing a predetermined part of the insulating partition.

The etching process using laser is performed to remove the cathode metal layer by rotating the laser downward from a horizontal axis in the range of 0~180°. Here, the laser is controlled in a rotation manner.

And, the etching process using laser is performed by moving back and forth with the laser fixed vertically downward.

The absorbent is BaO or $Y_2O_3$ of oxide series.

After the cathode electrode is formed, the present invention further comprises the steps of: forming absorbent between cathode electrodes on the insulating partition to prevent humidity; applying UV hardening resin for protection on the upper part of edge of the insulating partition; and forming capsule on the upper part of the UV hardening resin.

DETAILED DESCRIPTION OF THE INVENTION

The above objects, and other features and advantages of the present invention will become more apparent after reading the following detailed description when taken in conjunction with the drawings.

Figure 1A:
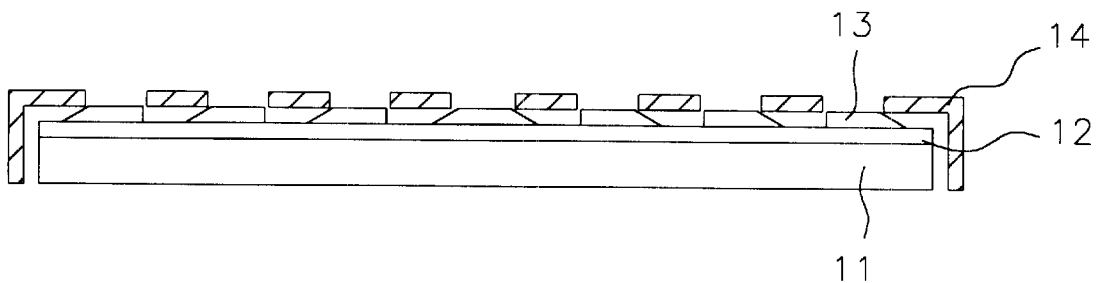
FIGS. 1A and 1B are cross sectional views for showing a conventional method for manufacturing cathode electrodes of electroluminescent display device.
Figure 1B:
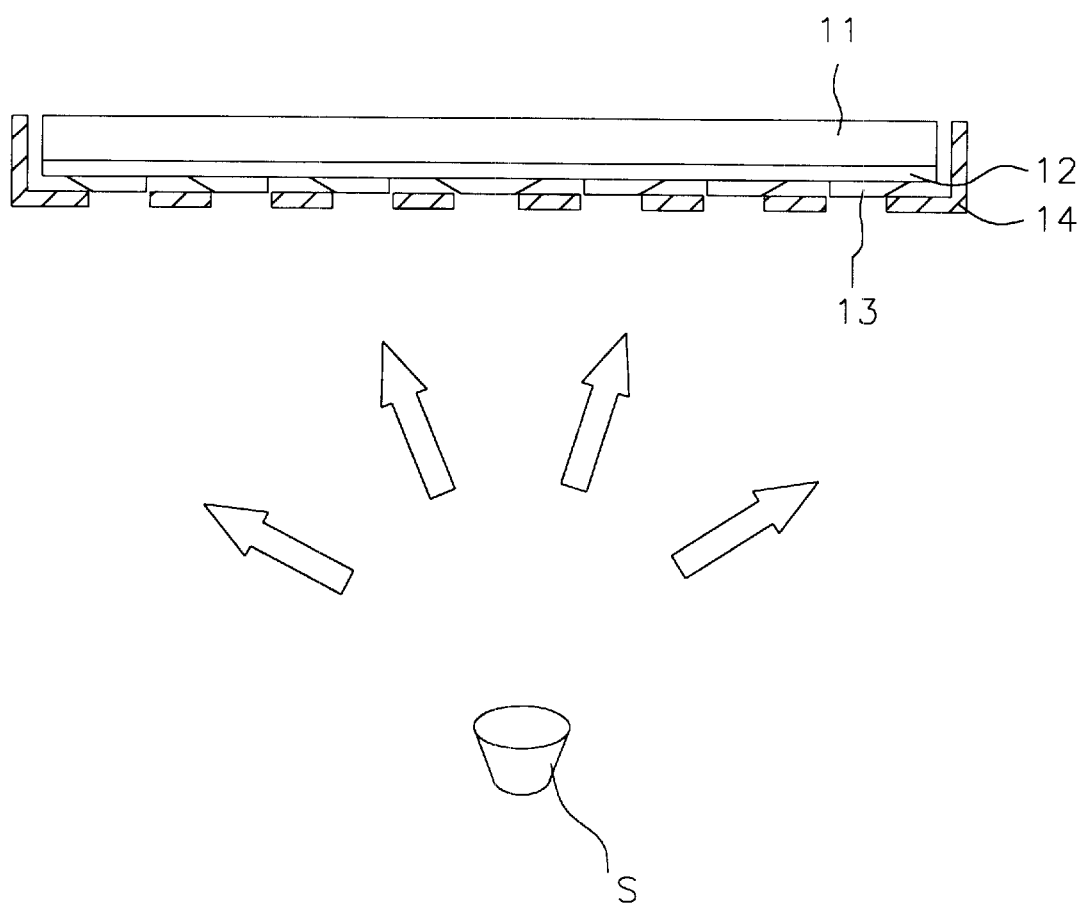
Figure 2:
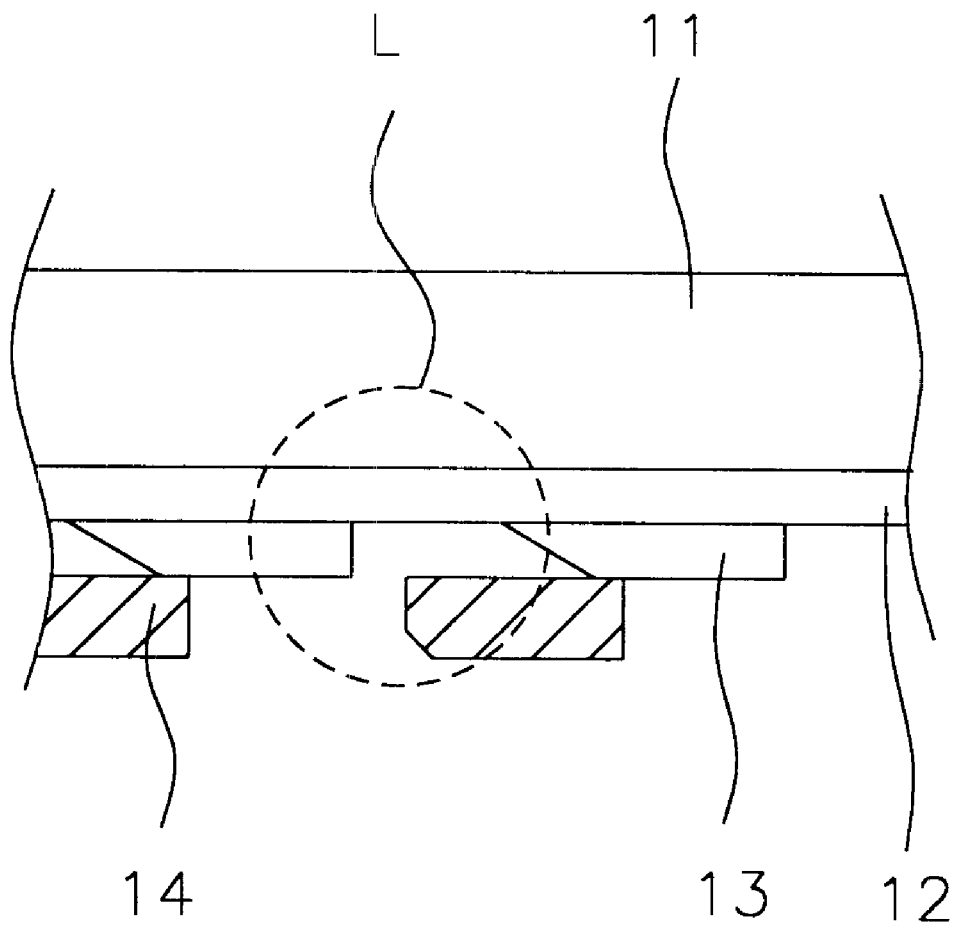
FIGS. 2 and 3 are cross sectional views for showing problems of the conventional method for manufacturing cathode electrodes of electroluminescent display device.
Figure 3:
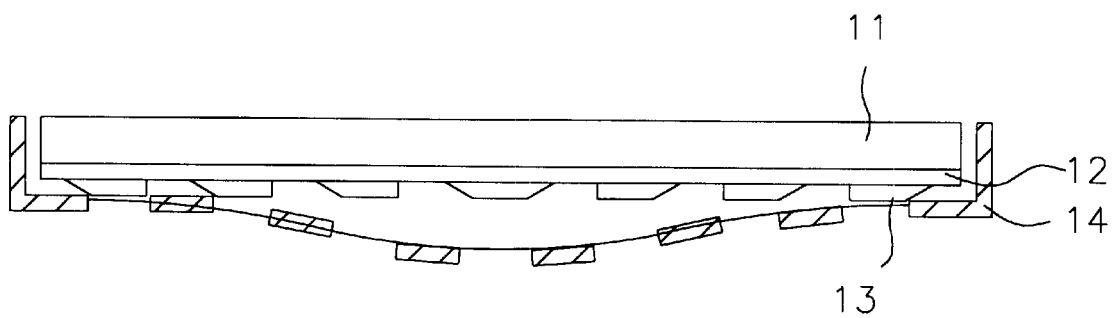
Figure 4:
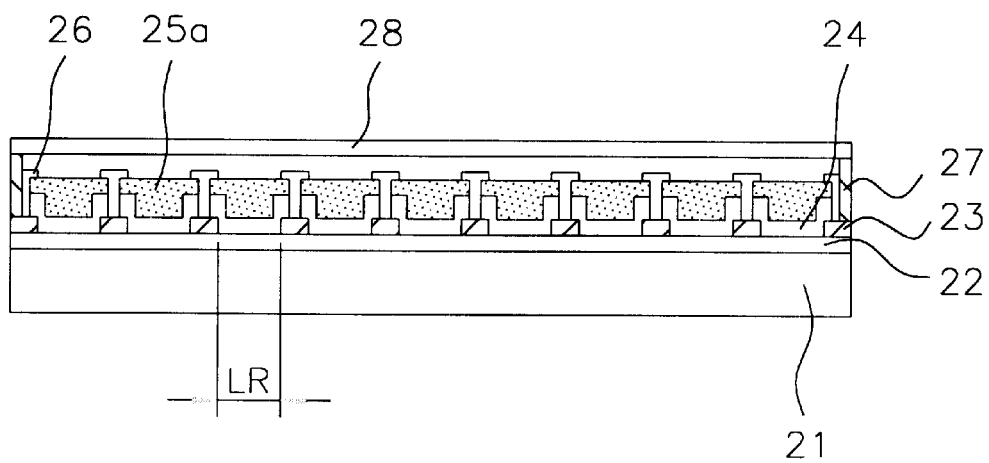
FIG. 4 is a cross sectional view of electroluminescent display device according to the present invention.

FIG. 4 is a cross sectional view of electroluminescent display device according to the present invention.

Referring to the FIG. 4, the present invention has a shape that a plurality of anode electrode patterns 22 of stripe structure are formed on the upper part of a transparent insulating substrate 21.

An insulating partition 23 is formed to prevent generation of shorts between the anode electrode and cathode electrode, crossing with the anode electrode patterns 22 on the transparent insulating substrate 21 having the anode electrode patterns 22 and an organic film pixel 24 comprising a hole transporting layer, a luminescent layer and an electron transporting layer is formed on the transparent insulating substrate 21 exposed by the insulating partition.

And, a cathode electrode pattern 25a is formed on the upper part of the organic film pixel 24 and an absorbing layer 26 is formed between the cathode electrode patterns 25a on the insulating partition 23.

And, UV hardening resin for protection 27 is applied on the edge of the insulating partition 23 and a capsule 28 is formed on the UV hardening resin 27.

The absorbing layer 26 is formed with BaO or $Y_2O_3$.

As shown in FIG. 4, when negative voltage is applied to the cathode electrode 25a and positive voltage to the anode electrode 22, the light is radiated through luminescent region LR of pixel between the insulating partition 23.

FIGS. 5A to 5E are cross sectional views for showing a method for manufacturing cathode electrodes of electroluminescent display device according to the present invention.

Figure 5A:
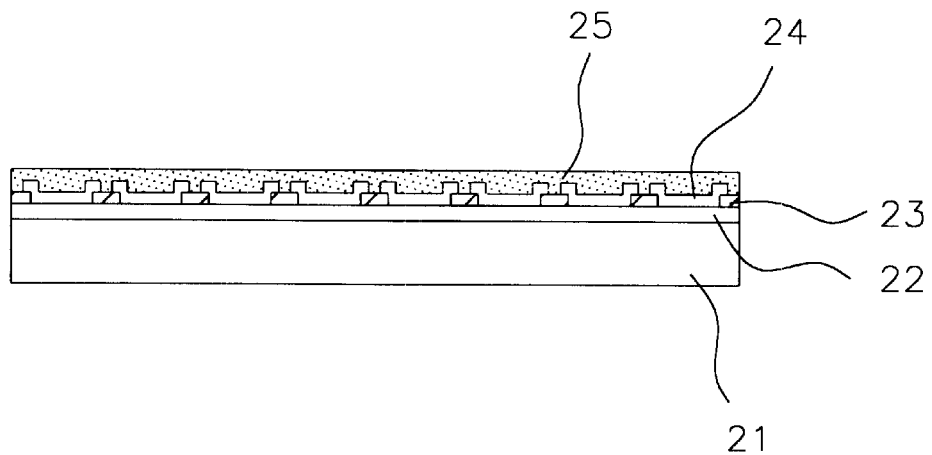
FIGS. 5A to 5E are cross sectional views for showing a method for manufacturing cathode electrodes of electroluminescent display device.

Referring to FIG. 5A, first, Indium Tin Oxide ITO is deposited as an anode pixel electrode on a transparent insulating substrate 21 and then, pattern etch processes are performed on the anode pixel electrode to form a plurality of anode electrode patterns 22 having a stripe shape.

Subsequently, an insulating partition 23 having a stripe shape is formed to cross with the anode electrode pattern 22 on the resulting structure.

Then, an organic film pixel 24 comprising a hole transporting layer, a luminescent layer and an electron transporting layer is formed on the substrate including the insulating partition 23. The organic film pixel 24 is formed, separated from each other with the insulating partition 23 interposed.

Afterwards, a cathode metal layer 25 is deposited on the surface of the transparent insulating substrate 21 including the organic film pixel 24 and the insulating partition 23.

Figure 5B:
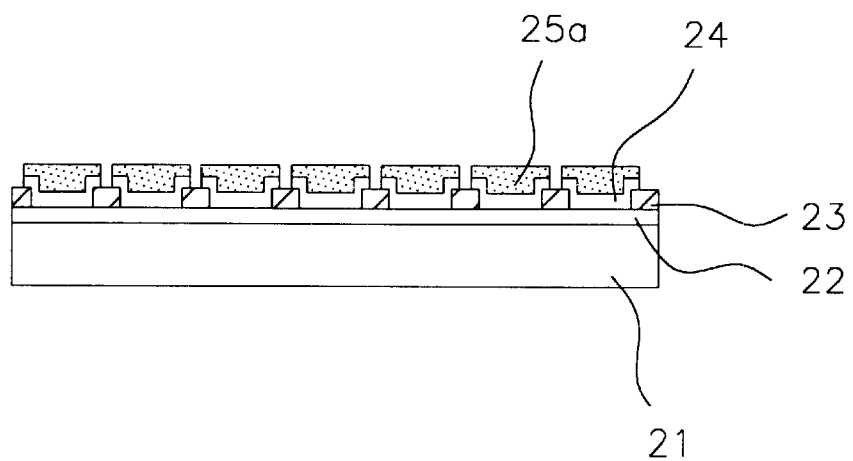

Referring to FIG. 5B, a cathode electrode pattern 25a is formed on the surface of the substrate 21 by performing pattern etch processes on the cathode metal layer. The cathode electrode pattern 25a is formed using a cutting feature of laser, that is, the cathode metal layer 25 deposited on the surface is etched with a desirable cathode electrode pattern gap by using laser without mask and the cathode metal layer 25 connecting each pixel is etched to expose the insulating partition 23.

Figure 5C:
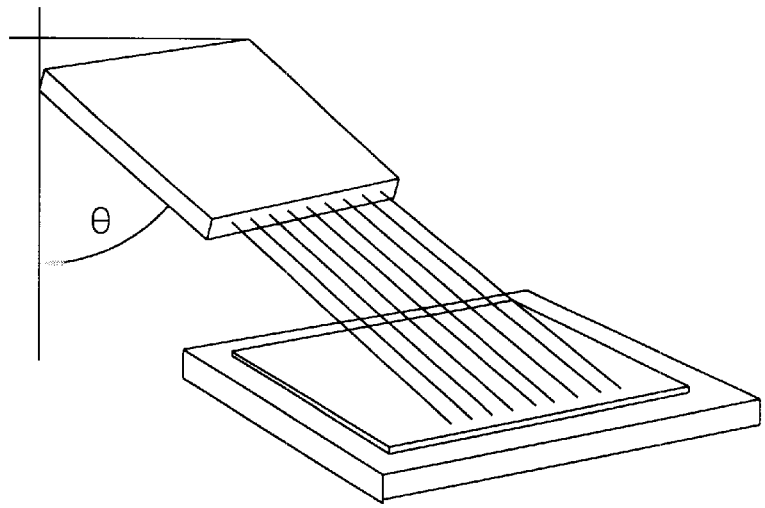
Figure 5D:
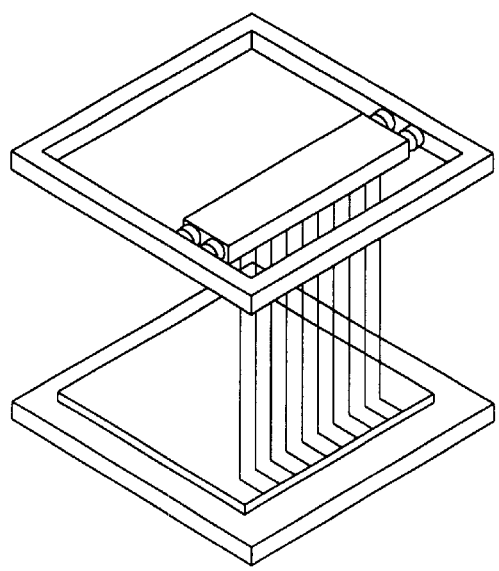

FIGS. 5C and 5D are drawings for showing pattern manners of cathode electrode performing etching process on cathode metal layer by using laser irradiation.

FIG. 5C shows a manner of patterning the cathode electrode by rotating laser horizontally downward on the horizontal axis to a predetermined angle Θ in the range of 0~180° with one end fixed and FIG. 5D shows a manner of patterning the cathode electrode by moving laser fixed vertically downward to the horizontal direction.

According to the above manners, it is possible to control etching thickness by power and moving speed of laser and control pattern width of cathode electrode by irradiation angle of laser.

Figure 5E:
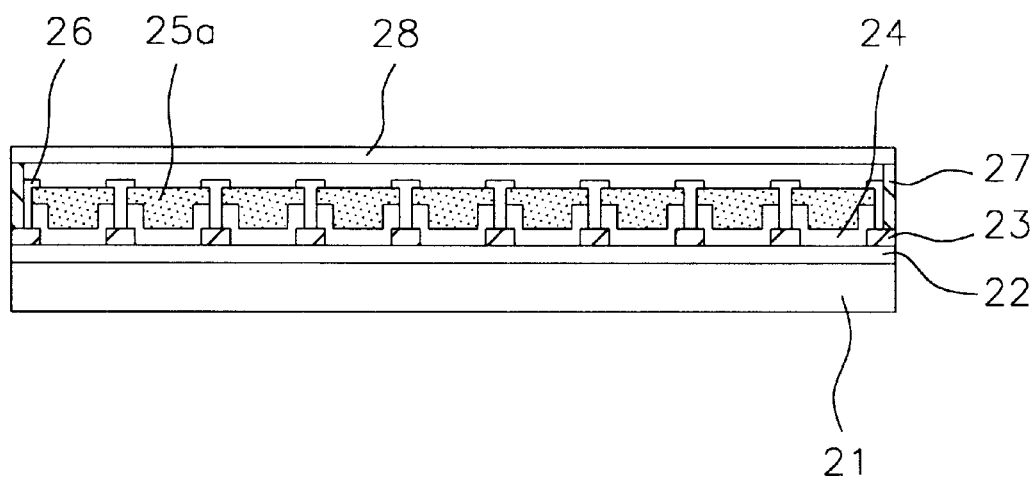

Referring to FIG. 5E, an absorbing layer 26 for preventing humidity is formed between the cathode electrode patterns 25a on the insulating partition 23.

The absorbing layer 26 is provided for prevention of humidity and of short generation in a metal line to improve stability in each pixel. The absorbing layer 26 is BaO or $Y_2O_3$ of oxide series.

Finally, a UV hardening resin 27 for protection is applied on the upper part of the edge of the insulating partition 23 and a capsule 28 is formed on the UV hardening resin 27, thereby completing fabrication of electroluminescent display device according to the present invention.

As described above, according to the present invention, cathode electrode patterns are formed by etching cathode metal layer using laser without a shadow mask. Therefore, it is possible to be employed without regard to the size of substrate.

And, it is possible to prevent deterioration of short between electrodes due to inaccurate contact since the shadow mask is not used. Moreover, it is also possible to prevent pollution of chamber generated in the change of shadow mask, thereby simplifying manufacturing processes and reducing the cost.

And, cathode electrode patterns are formed using laser and then absorbent is prepared on the etched part, thereby preventing humidity in pixels and improving reliability of device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing cathode electrodes of electroluminescent display device comprising the steps of:

forming an anode electrode on a transparent insulating substrate;

forming an insulating partition having a stripe structure to cross with the anode electrode and define a pixel formation area on the substrate;

forming an organic film pixel separated with a predetermined distance, with the insulating partition interposed;

depositing a cathode metal layer on the surface of the resulting structure; and forming a cathode electrode exposing a predetermined part of the insulating partition by performing etching processes on the cathode metal layer using laser.

2. The method for manufacturing cathode electrodes of electroluminescent display device according to claim 1, wherein the etching process using laser is performed to remove the cathode metal layer by controlling the laser in a rotation manner and by rotating the laser downward from a horizontal axis in the range of 0~180°.

3. The method for manufacturing cathode electrodes of electroluminescent display device according to claim 1, wherein the etching process using laser is performed by moving back and forth with the laser fixed vertically downward.

4. The method for manufacturing cathode electrodes of electroluminescent display device according to claim 1, further comprising the steps of:

forming an absorbent for prevention of humidity between the cathode electrodes on the insulating partition;

applying UV hardening resin for protection on the edge of the insulating partition; and forming a capsule on the upper part of the UV hardening resin.

5. The method for manufacturing cathode electrodes of electroluminescent display device according to claim 4, wherein the absorbent is BaO or $Y_2O_3$ of oxide series.

* * * * *

UNITED STATES PATENT AND TRADEMARK OFFICE
CERTIFICATE OF CORRECTION

PATENT NO.    : 6,617,254 B2
DATED         : September 9, 2003
INVENTOR(S)   : Joo Hyeon Lee et al.

It is certified that error appears in the above-identified patent and that said Letters Patent is hereby corrected as shown below:

Title page,
Item [*] Notice, the Patent Term Adjustment is -- 116 days --

Signed and Sealed this

Twenty-fourth Day of May, 2005

JON W. DUDAS
*Director of the United States Patent and Trademark Office*